(12) United States Patent
Lee

(10) Patent No.: US 9,992,882 B2
(45) Date of Patent: Jun. 5, 2018

(54) ELECTRONIC CONTROL UNIT

(71) Applicant: HYUNDAI AUTRON CO., LTD., Seongnam-si (KR)

(72) Inventor: Dong Gi Lee, Uiwang-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 0 days. days.

(21) Appl. No.: 15/378,486

(22) Filed: Dec. 14, 2016

(65) Prior Publication Data
US 2017/0171995 A1  Jun. 15, 2017

(30) Foreign Application Priority Data

Dec. 14, 2015 (KR) .................. 10-2015-0178458

(51) Int. Cl.
*H05K 5/00* (2006.01)
*H01R 12/72* (2011.01)
*H05K 5/02* (2006.01)

(52) U.S. Cl.
CPC ......... *H05K 5/0069* (2013.01); *H01R 12/724* (2013.01); *H05K 5/0017* (2013.01); *H05K 5/0056* (2013.01); *H05K 5/0213* (2013.01)

(58) Field of Classification Search
CPC .. H05K 5/0069; H05K 5/0017; H05K 5/0056; H05K 5/0213; H01R 12/724

USPC .......... 361/752, 679.01, 688, 704, 720, 722, 361/748, 760
See application file for complete search history.

(56) References Cited

U.S. PATENT DOCUMENTS 7,570,492 B2 * 8/2009 Gall .................... H05K 1/0272
361/700

FOREIGN PATENT DOCUMENTS

| JP | 2000-228243 A | 8/2000 |
|----|---------------|--------|
| JP | 2006-523945 A | 10/2006 |
| JP | 2012-136172 A | 7/2012 |
| JP | 2014-164825 A | 9/2014 |
| KR | 10-2013-0007099 A | 1/2013 |

* cited by examiner

*Primary Examiner* — Tremesha S Willis
(74) *Attorney, Agent, or Firm* — Baker McKenzie; Hyunho Park

(57) ABSTRACT

The present invention relates to an electronic control unit. The present invention provides an electronic control unit including: a housing which has an opening opened at one side of the housing; a printed circuit board which is accommodated in the housing and has electronic control elements mounted on the printed circuit board in order to perform a control operation; and a connector which is connected with the printed circuit board and coupled to the opening of the housing, in which a pressure correcting means, which connects an interior of the housing and an exterior of the housing and corrects pressure in the housing, is provided in the connector.

9 Claims, 5 Drawing Sheets

ELECTRONIC CONTROL UNIT

CROSS-REFERENCE TO RELATED APPLICATIONS

This application claims priority to and the benefit of Korean Patent Application No. 10-2015-0178458 filed in the Korean Intellectual Property Office on Dec. 14, 2015, the entire contents of which are incorporated herein by reference.

TECHNICAL FIELD

The present invention relates to an electronic control unit. More particularly, the present invention relates to an electronic control unit having a pressure correcting means which is provided in a connector of the electronic control unit and corrects pressure between an interior and an exterior of a housing, thereby simplifying a structure and minimizing damage caused by outside exposure.

BACKGROUND ART

In general, an electronic control device such as an electronic control unit (ECU), which electronically controls various types of accessorial devices, is equipped in a vehicle. The electronic control device receives information from sensors or switches installed at several positions in the vehicle, and processes the received information to perform various electronic control operations.

The electronic control device, which controls states of an engine, an automatic transmission, an ABS, and the like of the vehicle by using a computer, electronically controls a driving system, a braking system, a steering system, and the like as well as the automatic transmission of the vehicle.

The electronic control device such as the ECU, which is provided in the vehicle, has a structure that includes a housing having a cover at an upper side thereof and a base at a lower side thereof, and connectors for connecting a printed circuit board (PCB) accommodated in the housing with an external socket or the like.

The housing is structured to be assembled together with the PCB while covering the PCB, and in this case, the connector, which is positioned between the cover and the base when the cover and the base are assembled, has a sealing unit for sealing the connector, the cover, and the base. With the sealing unit, it is possible to prevent outside moisture or foreign substances from being introduced into the housing. In some instances, the housing is formed in one piece having a container shape, and in this case, the PCB is inserted into the housing, and the connector is coupled to an opening of the housing.

In the case of the electronic control device, it is necessary to maintain constant pressure between an interior and an exterior of the housing connected with the connector in order to stably transmit an electrical signal, and to this end, a separate air pressure correcting device has been used.

However, the air pressure correcting device is typically configured as an independent and separate component and mounted to the housing (e.g., a cover of the housing), and as a result, there are problems in that a separate space is required to install the air pressure correcting device when assembling the vehicle, and a large amount of time and costs is required to manufacture the air pressure correcting device as an independent and separate component.

LITERATURE OF RELATED ART

Patent Literature

Korean Patent Application Laid-Open No. 10-2013-0007099 (published on Jan. 18, 2013)

SUMMARY OF THE INVENTION

The present invention has been made in an effort to provide an electronic control unit which has a pressure correcting means provided directly in a connector of the electronic control unit, thereby reducing a working space, working time, and costs.

An exemplary embodiment of the present invention provides an electronic control unit including: a housing which has an opening opened at one side of the housing; a printed circuit board which is accommodated in the housing and has electronic control elements mounted on the printed circuit board in order to perform a control operation; and a connector which is connected with the printed circuit board and coupled to the opening of the housing, in which a pressure correcting means, which connects an interior of the housing and an exterior of the housing and corrects pressure in the housing, is provided in the connector.

The pressure correcting means may be formed as the connector is provided with a venting hole which is exposed to the outside of the housing, and a venting channel which allows the venting hole and the interior of the housing to communicate with each other.

The venting hole may be formed in the form of any one of a hole, a slit, and a slot in a connector front end portion exposed to the outside in a state in which the connector is coupled to the housing.

The venting hole and the venting channel may be formed by attaching a member having the venting hole and the venting channel to a side surface of the connector.

An air-permeable separating membrane may be provided in the venting hole or on a surface of the connector in which the venting hole is formed.

Fixing guides, which protrude from a side surface of the connector so as to surround the venting hole, may be additionally provided on the side surface of the connector.

A venting hole protecting plate, which has a through hole that communicates with the venting hole, may be coupled to the connector by being guided by the fixing guide.

The fixing guides may include a first fixing guide and a second fixing guide which are spaced apart from each other at an interval to form a catching protrusion accommodating portion, and the venting hole protecting plate may include a catching protrusion coupled to the catching protrusion accommodating portion.

An air-permeable separating membrane may be provided on a surface of the connector in which the venting hole is formed, and a venting hole protecting plate, which has a through hole that communicates with the venting hole, may be attached to an outer portion of the separating membrane.

Fixing guides, which protrude from a side surface of the connector so as to surround the venting hole, may be provided, a portion surrounded by the fixing guides may be formed as a welding surface, and the venting hole protecting plate may be attached to the welding surface with the separating membrane interposed therebetween.

According to the electronic control unit according to the present invention, no pressure correcting means is installed in the housing, and the pressure correcting means and the connector are manufactured in one piece, thereby reducing costs and working time. Since a vehicle side connector covers the pressure correcting means provided in the connector of the electronic control unit when the vehicle side connector is connected to the connector of the electronic control unit, thereby protecting the pressure correcting means from the outside.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
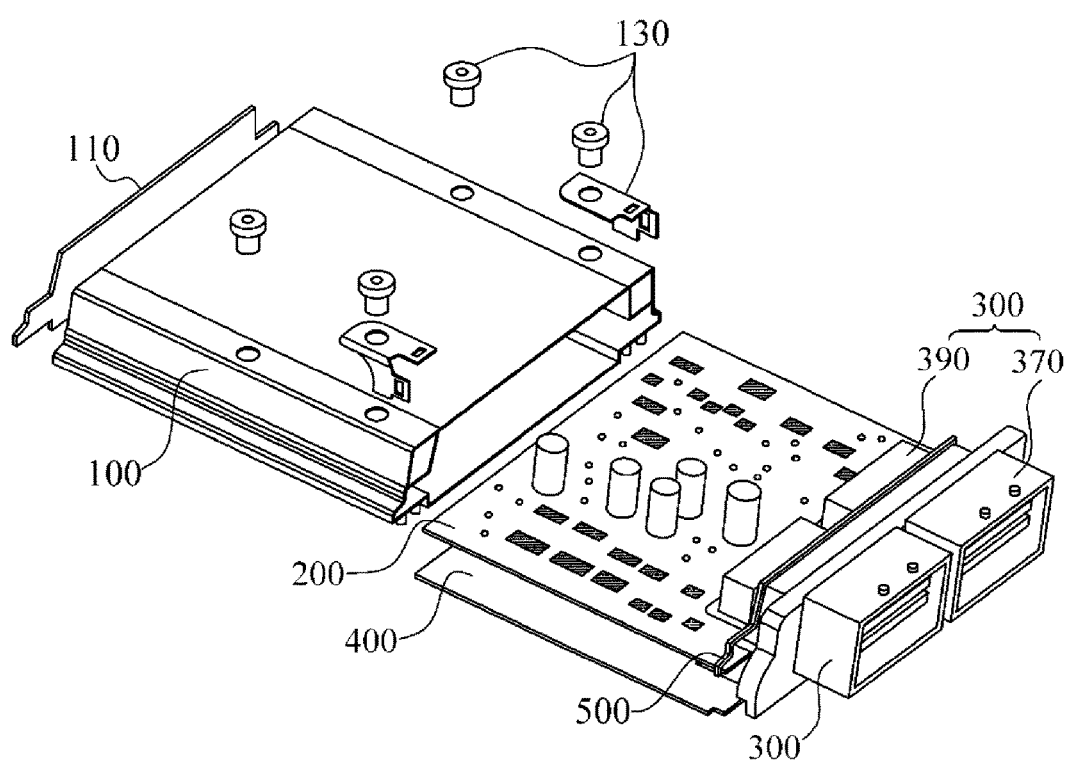
FIG. 1 is an exploded perspective view of an electronic control unit according to the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout several figures of the drawing.

DETAILED DESCRIPTION

Hereinafter, an electronic control unit according to an exemplary embodiment of the present invention will be described in detail with reference to the accompanying drawings so that those skilled in the art to which the present invention pertains may easily carry out the exemplary embodiment. The present invention is not limited to the exemplary embodiments described herein, and may be embodied in various different forms. A part irrelevant to the description will be omitted to clearly describe the present invention, and the same or similar constituent elements will be designated by the same reference numerals throughout the specification.

FIG. 1 is a perspective view illustrating a state in which an electronic control unit according to the present invention is disassembled. As illustrated, the electronic control unit includes a housing 100, a printed circuit board 200 which is inserted into the housing 100, and a connector 300 which is connected to the printed circuit board 200 and coupled to an opening at one side of the housing 100. A heat radiating pad 400, which transfers heat generated from electronic control elements mounted on the printed circuit board 200 to the housing 100, may be provided at a lower side of the printed circuit board 200.

The housing 100 has a container shape, and a back cover 110, which closes one side of the housing 100, is provided at a rear end portion of the housing 100. The housing 100 may be formed by an extrusion method to have a one-piece container shape having a cross section having a uniform profile. Like the electronic control unit in the related art, the housing 100 may include a base member, and a cover coupled to an upper portion of the base member. The housing 100 may include fasteners 130 for fixing the housing 100 to other members. A sealing unit 500, which seals a coupling portion in order to maintain airtightness, may be provided on coupling surfaces between the connector 300 and the housing 100.

The connector 300 may include a connector front end portion 370 at a front side thereof, and a connector rear end portion 390 at a rear side thereof. The connector front end portion 370 is exposed to the outside when the connector 300 is coupled to the housing 100, and outer connector pins are provided in the connector front end portion 370 so as to be connected to exterior components. The connector rear end portion 390 is inserted into the housing 100, and inner connector pins connected with the printed circuit board 200 are provided in the connector rear end portion 390.

Figure 2:
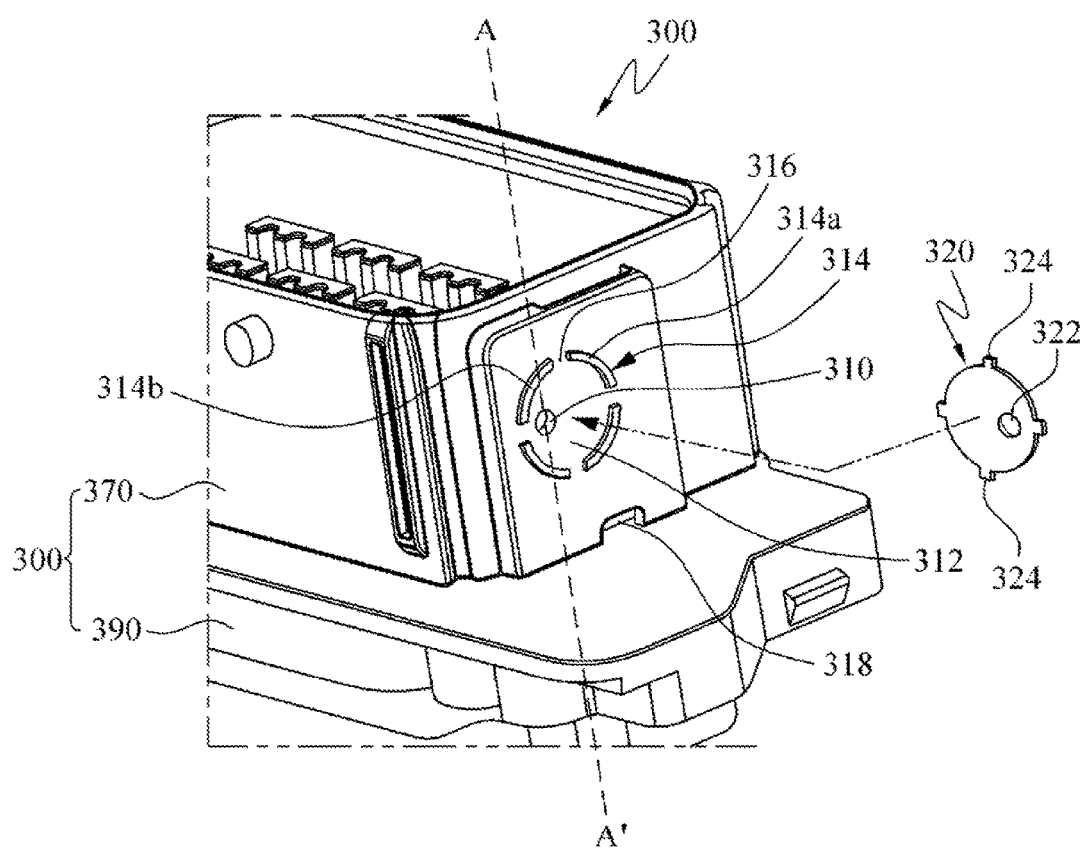
FIG. 2 is a perspective side view of a connector of the electronic control unit according to the present invention.
Figure 3:
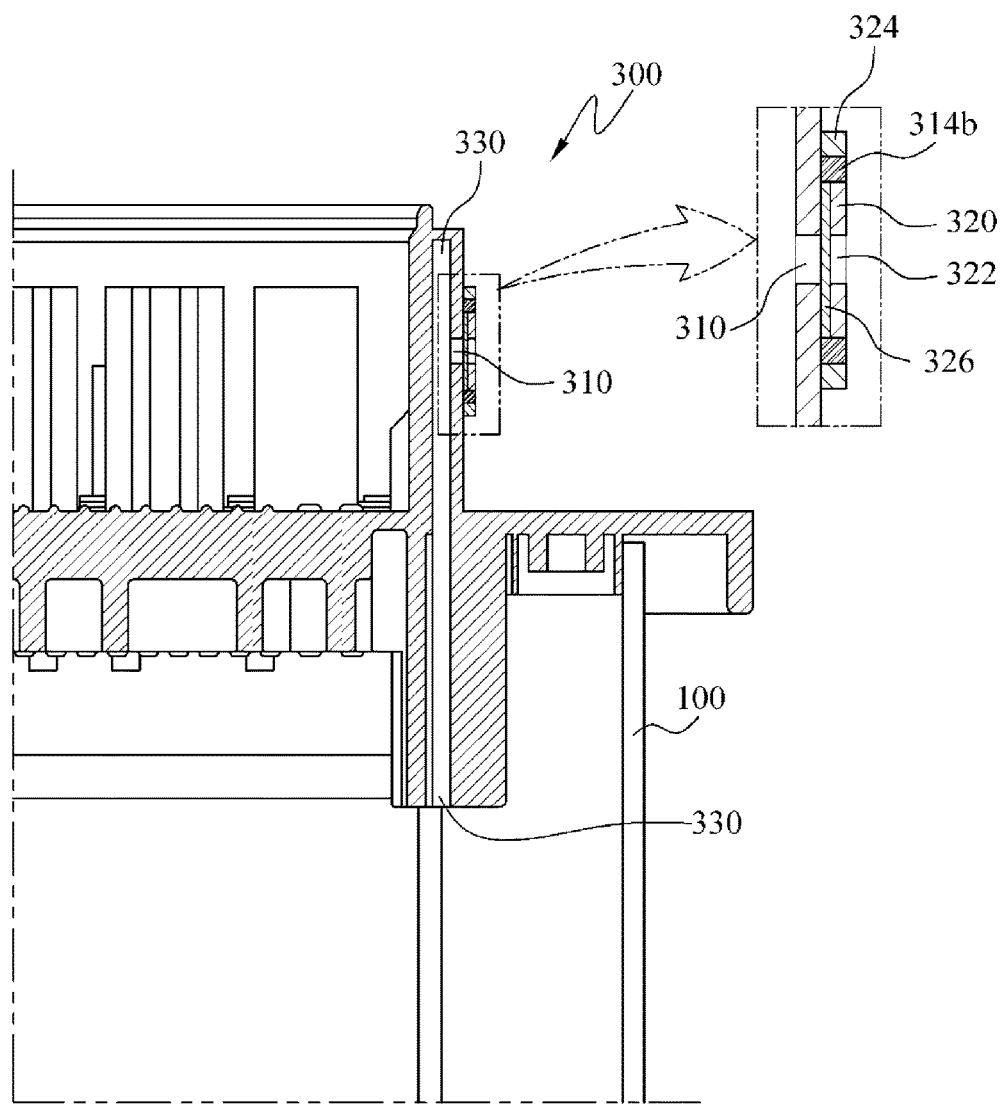
FIG. 3 is a cross-sectional view taken along line A-A' in FIG. 2.

FIG. 2 is a perspective view illustrating a state in which a venting hole 310 is provided in the connector 300 of the electronic control unit according to the present invention, and FIG. 3 is a view illustrating a cross section of the connector 300 according to the present invention taken along line A-A' in FIG. 2.

As illustrated in FIG. 2, the venting hole 310 may be provided in the form of a hole, and may be formed in the connector front end portion 370 which is exposed to the outside when the connector 300 is coupled to the housing 100. The venting hole 310 may be provided as a single hole as illustrated, and in some instances, may be provided in the form of a plurality of holes or slits.

The venting hole 310 enables air to flow between the housing 100 and an exterior of the housing 100. Since the air may flow through the venting hole 310, internal pressure of the housing 100 may be adjusted based on external pressure of the housing 100.

Fixing guides 314 are formed at the periphery of the venting hole 310. The fixing guides 314 may be formed in the form of protrusions that surround the venting hole 310. In one exemplary embodiment, the fixing guides 314 may include a first fixing guide 314a and a second fixing guide 314b which are disposed at an interval. The fixing guides 314 may serve to guide a venting hole protecting plate 320 to a fixing position, and assist in fixing the venting hole protecting plate 320. An inner surface of the fixing guides 314 becomes a welding surface 312 on which the venting hole protecting plate 320 is seated.

The venting hole protecting plate 320 may be configured in the form of a plate, and may include a through hole 322 which communicates with the venting hole 310, and catching protrusions 324 which protrude outward. The venting hole protecting plate 320 is seated on the welding surface 312, and the venting hole 310 formed in the connector 300 and the through hole 322 formed in the venting hole protecting plate 320 communicate with each other, thereby enabling a flow of air. Therefore, air pressure in the housing 100 is adjusted.

In this case, one or more catching protrusion accommodating portions 316 are provided between the first fixing guide 314a and the second fixing guide 314b, and the catching protrusion 324 of the venting hole protecting plate 320 may be coupled to the catching protrusion accommodating portion 316. The configuration in which the catching protrusion 324 and the catching protrusion accommodating portion 316 are coupled to each other may provide an additional advantage in that the configuration assists in aligning the positions of the venting hole 310 and the through hole 322.

Referring to FIG. 3, a separate air-permeable separating membrane 326 may be provided between the welding surface 312 and the venting hole protecting plate 320. The air-permeable separating membrane 326 allows gas to pass therethrough, but blocks moisture. That is, a separating member in the form of a membrane is provided between the venting hole 310 and the through hole 322, and enables an inflow and an outflow of air, but blocks moisture or foreign substances.

In the exemplary embodiment of the present invention, the separating membrane 326 may be provided to cover the venting hole 310, or may be mounted in the venting hole 310. In a case in which the separating membrane 326 is provided to cover the venting hole 310, it is possible to protect the separating membrane 326 from the outside when the venting hole protecting plate 320 is provided to cover a surface of the separating membrane 326.

In one exemplary embodiment, the air-permeable separating membrane 326 is fixed by a separate fastening means or a separate adhesion means so that the air-permeable separating membrane 326 is in close contact with the welding surface 312 and the venting hole protecting plate 320 so as not to be separated. That is, the separating membrane 326 may be adhered to the welding surface 312 or one surface of the venting hole protecting plate 320 so that the separating membrane 326 is in securely close contact with the welding surface 312 and the venting hole protecting plate 320.

The fixing guides 314 may be manufactured separately from the connector 300, and then be fixed to the periphery of the venting hole 310, or the fixing guides 314 may be manufactured integrally with the connector 300.

A drain hole 318 may be provided at a lower side of the connector 300. The drain hole 318 is formed to discharge water droplets present at an outer side of the connector 300, and may be penetratively formed in a vertical direction as illustrated in FIG. 2. The drain hole 318 may be formed in the front end portion 370 of the connector 300, that is, at a portion of the connector 300 which is exposed to the outside after the connector 300 is coupled to the housing 100.

Referring to FIG. 3, a venting channel 330 is formed in the connector 300. The venting channel 330 is a channel that connects the interior of the housing 100 and the venting hole 310 formed in the connector front end portion 370 when the connector 300 is coupled to the housing 100.

In a case in which air pressure outside the housing 100 is higher than air pressure in the housing 100, outside air is introduced into the venting hole 310, moved along the venting channel 330, and delivered into the housing 100. In a case in which air pressure in the housing 100 is higher than air pressure outside the housing 100, air in the housing 100 passes through the venting channel 330 via an opening of the venting channel 330 which is opened toward the interior of the housing 100, and then flows to the outside through the venting hole 310.

The venting channel 330 may be formed along a side surface of the connector 300 in a direction from the connector front end portion 370 to the connector rear end portion 390.

As illustrated in FIG. 3, the venting hole 310, the fixing guides 314 which surround the venting hole 310, and the welding surface 312 are provided on the side surface of the connector 300, and the venting hole protecting plate 320 is coupled to the welding surface 312 with the separating membrane 326 interposed therebetween. In one exemplary embodiment, the catching protrusion 324 of the venting hole protecting plate 320 is fastened to the catching protrusion accommodating portion 316 formed between the fixing guides 314, and the through hole 322 formed in the venting hole protecting plate 320 communicates with the venting hole 310 with the separating membrane 326 interposed therebetween.

A size of the venting hole 310 may be modified based on an environment in which the electronic control unit is used and according to intended use.

Figure 4:
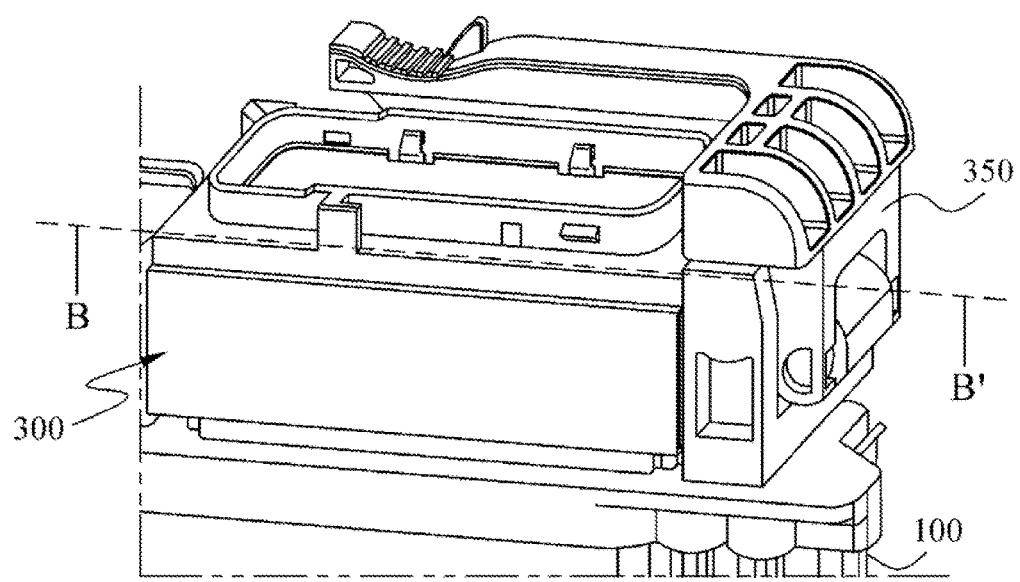
FIG. 4 is a perspective view for explaining a state in which the electronic control unit according to the present invention is installed.
Figure 5:
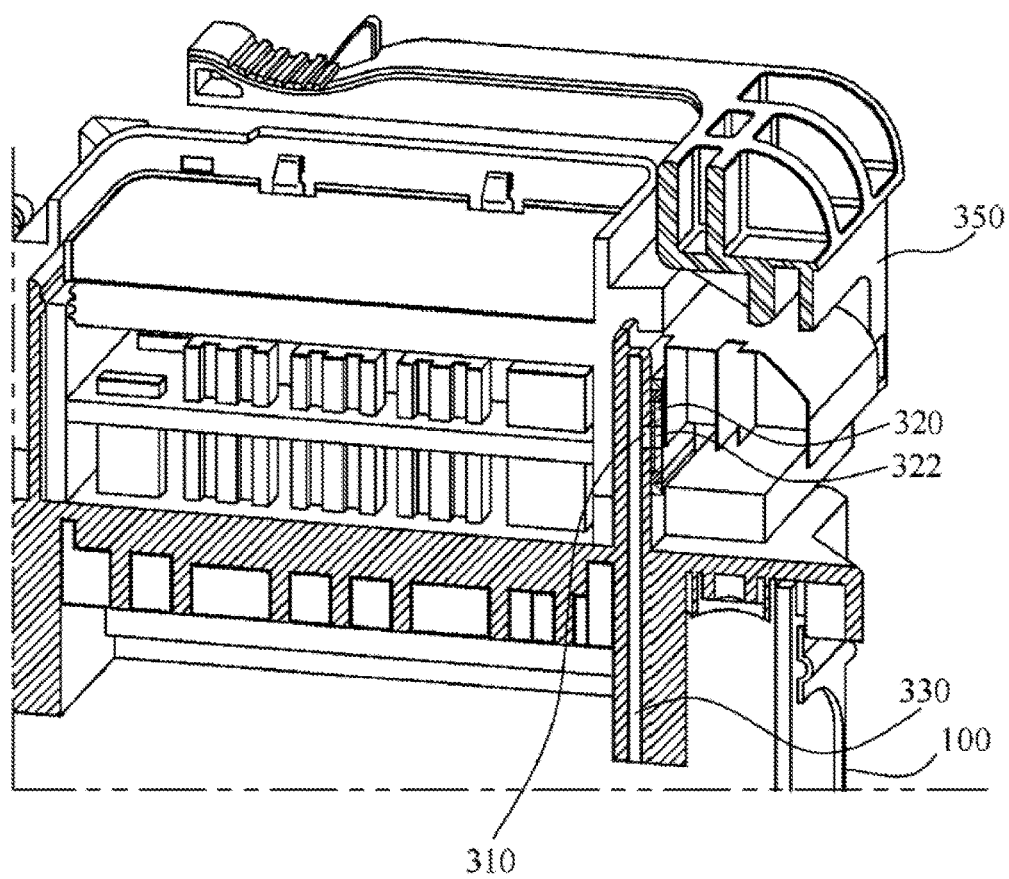
FIG. 5 is a cross-sectional view taken along line B-B' in FIG. 4.

FIG. 4 is a perspective view illustrating a state in which the connector 300 of the electronic control unit according to the present invention is fastened to a vehicle side connector 350, and FIG. 5 illustrates cross sections of the connector 300 and the vehicle side connector 350 taken along line B-B' in FIG. 4.

The vehicle side connector 350 is coupled to the connector 300 when the electronic control unit is mounted to the vehicle or the like. The vehicle side connector 350 may be provided to cover the connector 300, and in this case, the venting hole 310 is protected by the vehicle side connector 350.

In some instances, in addition to the vehicle side connector 350, a protective means may be additionally provided to protect or isolate the venting hole 310 and the venting hole protecting plate 320 from the outside so as to prevent an inflow of foreign substances.

The vehicle side connector 350 may be formed to have a structure in which the vehicle side connector 350 is coupled at a predetermined interval from the venting hole 310 and the venting hole protecting plate 320, and a structural shape of the vehicle side connector 350 may be changed to easily introduce air outside the housing 100 or easily discharge air inside the housing 100.

The venting hole 310 according to the present invention is provided in the form of a hole as described above, and communicates with the venting channel 330, thereby introducing air outside the housing 100 and discharging air inside the housing 100.

The principle and the constituent elements for correcting pressure by using the venting hole 310 and the venting hole protecting plate 320 have been described above, but the positions and the shapes of the venting hole 310 and the venting hole protecting plate 320 may be variously modified and implemented based on the shape and the installation position of the vehicle side connector 350.

The connector 300 may be formed in one piece in order to allow the venting hole 310 and the venting channel 330 to communicate with each other by manufacturing a mold, or a member for forming the venting channel 330 may be separately manufactured and then attached to one surface of the connector 300.

As described above, the pressure correcting means, which includes the venting hole 310, the venting channel 330, and the separating membrane 326, is provided in the electronic control unit, and the venting hole protecting plate 320 may be additionally provided to protect or fix the venting hole 310 and the separating membrane 326.

With the improved structure, the electronic control unit according to the present invention may be used for an electronic control unit which is easily assembled and may reduce costs because it is not necessary to provide a separate pressure correcting means in the housing of the electronic control unit.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control unit comprising:
    a housing which has an opening opened at one side of the housing;
    a printed circuit board which is accommodated in the housing and has electronic control elements mounted on the printed circuit board in order to perform a control operation; and
    a connector which is connected with the printed circuit board and coupled to the opening of the housing,
    wherein a pressure correcting means, which connects an interior of the housing and an exterior of the housing and corrects pressure in the housing, is provided in the connector,
    wherein the pressure connecting means includes a venting hole and a venting channel,
    wherein the venting hole is exposed to the outside of the housing and provided in the connector, and
    wherein the venting channel connects the venting hole with the interior of the housing and is formed along a side surface of the connector.

2. The electronic control unit of claim 1, wherein the venting hole is formed in a form of any one of a hole, a slit, and a slot in a connector front end portion exposed to the outside in a state in which the connector is coupled to the housing.

3. The electronic control unit of claim 1, wherein the venting hole and the venting channel are formed by attaching a member having the venting hole and the venting channel to a side surface of the connector.

4. The electronic control unit of claim 1, wherein an air-permeable separating membrane is provided in the venting hole or on a surface of the connector in which the venting hole is formed.

5. The electronic control unit of claim 1, wherein fixing guides, which protrude from a side surface of the connector so as to surround the venting hole, are additionally provided on the side surface of the connector.

6. The electronic control unit of claim 5, wherein a venting hole protecting plate, which has a through hole that is connected with the venting hole, is coupled to the connector by being guided by the fixing guides.

7. The electronic control unit of claim 6, wherein the fixing guides include a first fixing guide and a second fixing guide which are spaced apart from each other at an interval to form a catching protrusion accommodating portion, and the venting hole protecting plate includes a catching protrusion coupled to the catching protrusion accommodating portion.

8. The electronic control unit of claim 1, wherein an air-permeable separating membrane is provided on a surface of the connector in which the venting hole is formed, and a venting hole protecting plate, which has a through hole that is connected with the venting hole, is attached to an outer portion of the separating membrane.

9. The electronic control unit of claim 8, wherein fixing guides, which protrude from a side surface of the connector so as to surround the venting hole, are provided, a portion surrounded by the fixing guides is formed as a welding surface, and the venting hole protecting plate is attached to the welding surface with the separating membrane interposed therebetween.

* * * * *